(12) United States Patent
Nikkel et al.

(10) Patent No.: US 6,979,585 B2
(45) Date of Patent: Dec. 27, 2005

(54) MICRO-ELECTROMECHANICAL SYSTEM

(75) Inventors: Eric L. Nikkel, Philomath, OR (US); Stephen J Potochnik, Corvallis, OR (US); Charles C Haluzak, Corvallis, OR (US); Chien-Hua Chen, Corvallis, OR (US); Mickey Szepesi, Salem, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 90 days.

(21) Appl. No.: 10/683,909

(22) Filed: Oct. 10, 2003

(65) Prior Publication Data

US 2005/0077612 A1    Apr. 14, 2005

(51) Int. Cl.[7] .............................................. H01L 21/00
(52) U.S. Cl. .............................. 438/48; 438/22; 438/7; 438/17; 438/29
(58) Field of Search .......................... 438/50–51, 689, 438/709

(56) References Cited

U.S. PATENT DOCUMENTS

| 4,062,623 | A | * | 12/1977 | Suzuki et al. ................ 359/209 |
| 5,589,082 | A | * | 12/1996 | Lin et al. ......................... 216/2 |
| 6,822,326 | B2 | * | 11/2004 | Enquist et al. ............... 257/729 |
| 6,873,450 | B2 | * | 3/2005 | Patel et al. ................... 359/291 |
| 2005/0017313 | A1 | * | 1/2005 | Wan ............................ 257/415 |

* cited by examiner

*Primary Examiner*—Luan Thai

(57) ABSTRACT

A microelectromechanical system (MEMS) device is created by forming mechanical structures supported by a substrate having a bond ring area laterally spaced from the mechanical structures and having a sacrificial layer surrounding the mechanical structures. A bond ring material is formed on top of the sacrificial layer and the bond ring area. Some of the bond ring material is then removed to create a bond ring.

22 Claims, 10 Drawing Sheets

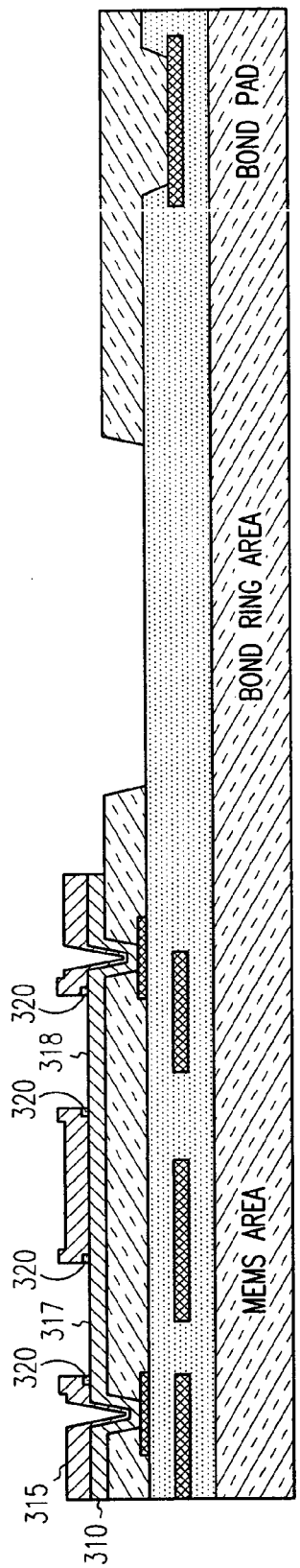
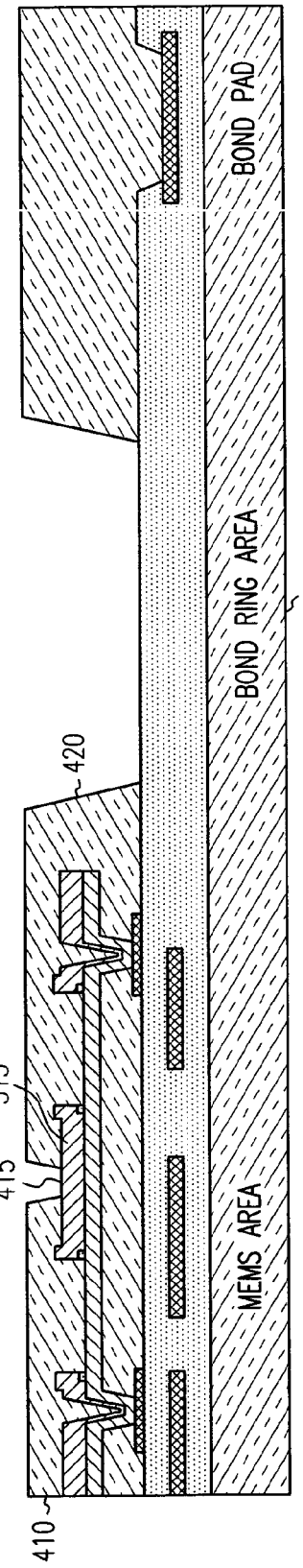
FIG. 3
FIG. 4

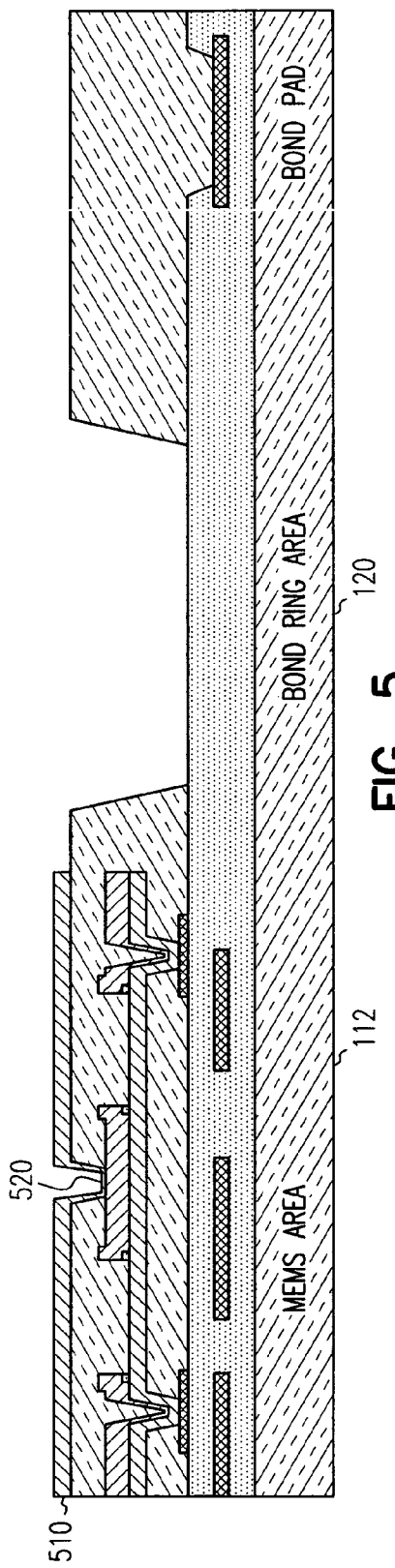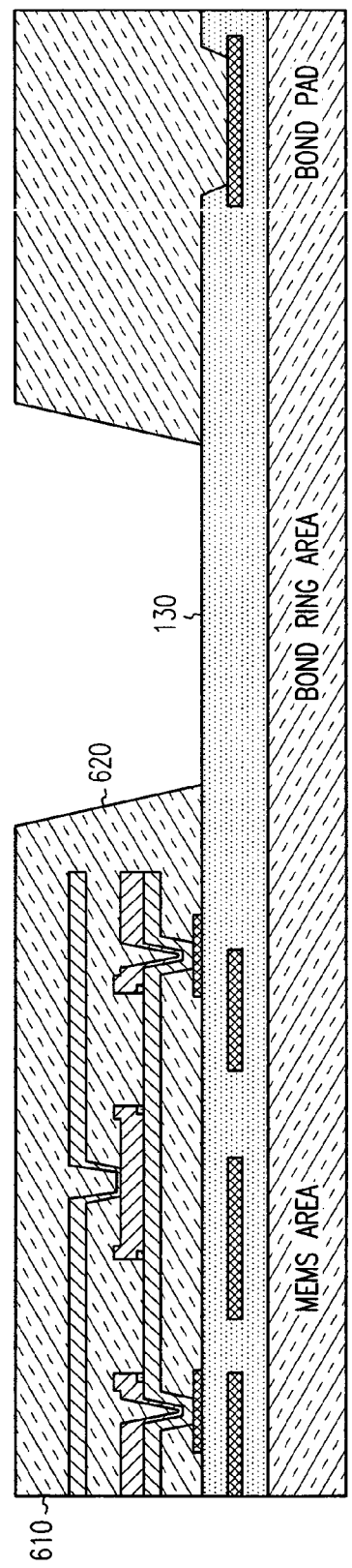

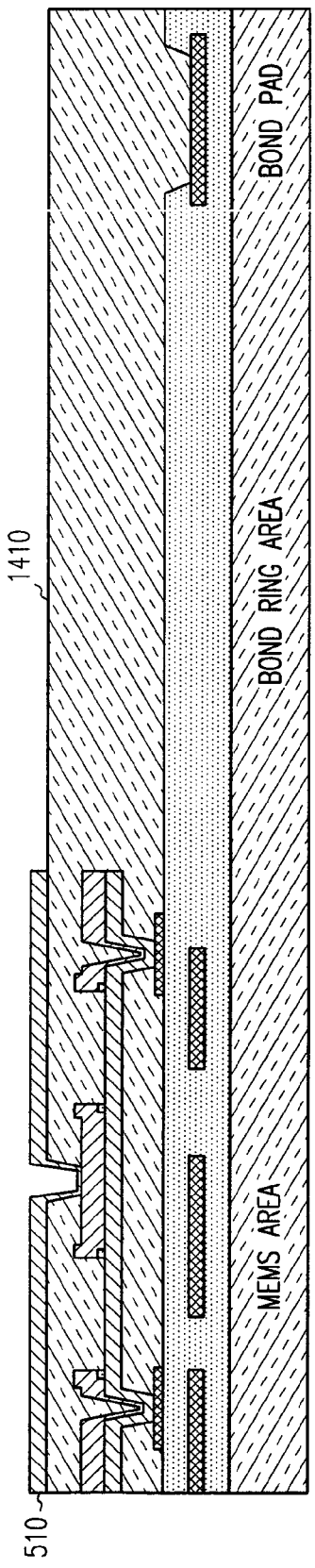
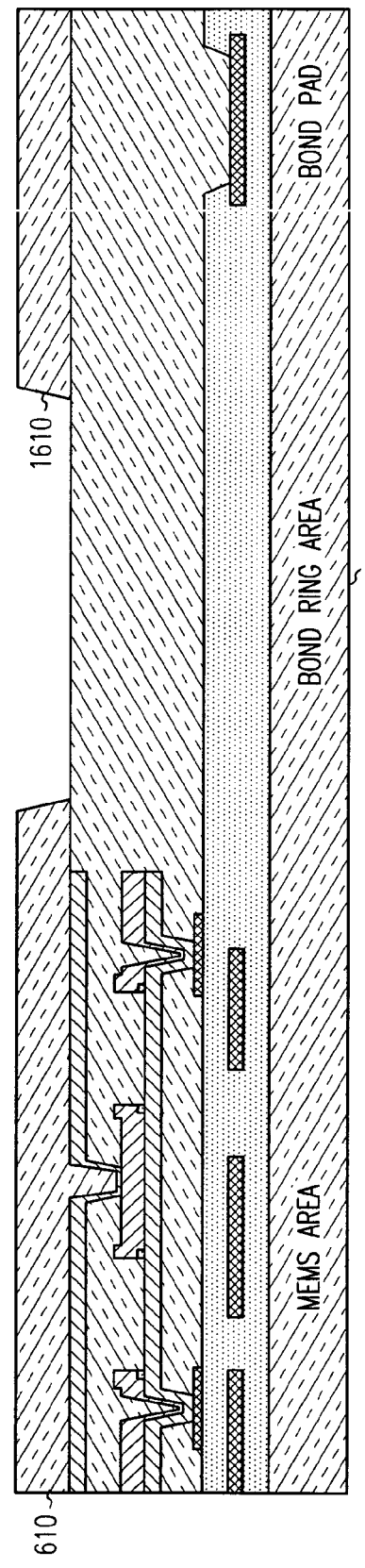

MICRO-ELECTROMECHANICAL SYSTEM

RELATED APPLICATION

This application is related to U.S. application entitled: "Cover Secured to Bond Ring" application Ser. No. 10/683,910, filed on the same date herewith, which is incorporated herein by reference.

FIELD OF THE INVENTION

The present invention relates to micro-electromechanical system (MEMS) devices, and in particular to a bond ring for MEMS devices.

BACKGROUND OF THE INVENTION

Micro-electromechanical system (MEMS) devices are very small and fragile. They need to be protected from physical harm and contamination. Some MEMS devices require a special environment, such as a gas or liquid fluid, in which to operate. Prior attempts to provide such protection involve the use of a cover, such as a window or plate fixed over the MEMS device to protect it. Such windows or plates may be fixed on an annular ring of a polymer extending above and around the MEMS device. It may be difficult to form the ring with desired materials due to thermal budget constraints. The ring may also need to be formed in such a manner to facilitate sufficient sealing of the cover.

BRIEF DESCRIPTION OF THE DRAWINGS

FIGS. 1, 2, 3, 4, 5, 6, 7, 8, 9 and 10 are side elevation representations illustrating formation of a device having a bond ring area according to an embodiment of the invention.

FIGS. 12, 13, 14, 15, 16 and 17 are side elevation representations illustrating alternative formation of a device having a bond ring area according to an embodiment of the invention.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. In the example embodiments, the methods include elements that are arranged serially. However, in other embodiments, the elements may be performed in a different order, or simultaneously. The following description is, therefore, not to be taken in a limited sense, and the scope of the present invention is defined by the appended claims.

Figure 1:
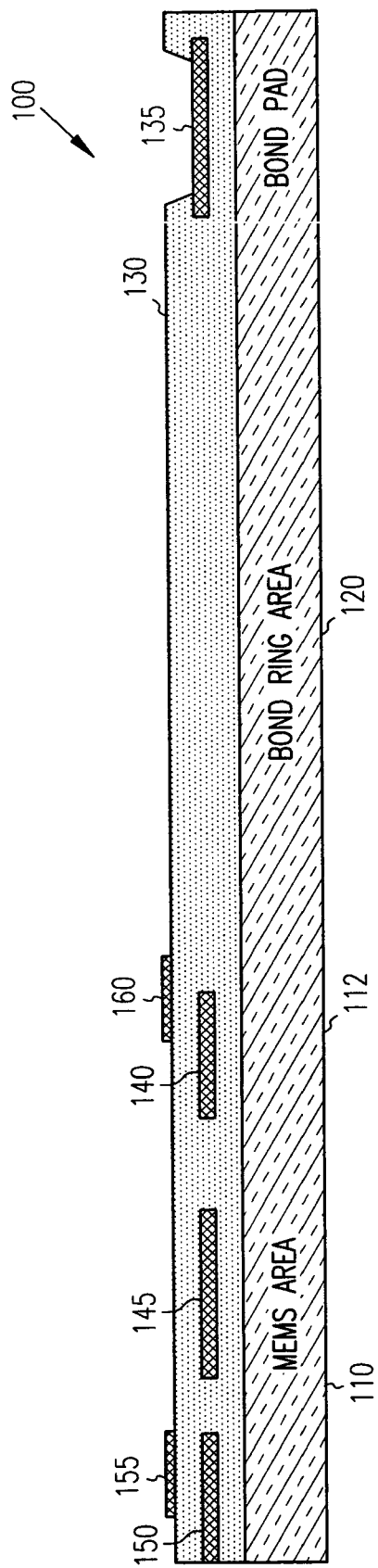

FIG. 1 shows a cross sectional representation taken during formation of a device 100. Device 100 is formed on a substrate 110, on which a micro-electromechanical system (MEMS) device will be formed on a MEMS area portion 112 of the substrate 110. The substrate 110 extends laterally to a bond ring area 120, which is also part of substrate 110 in one embodiment. The bond ring area will form an annular platform, surrounding the MEMS device, and supporting a cover, such as a plate, or transparent glass sheet as desired based on operating characteristics of the MEMS device. The bond ring area need not be circular, but may be shaped to effectively cover the MEMS device.

FIG. 1 also illustrates other structures that are used in the formation of a MEMS device. Many different types of MEMS device may be formed, and for example purposes, an optical MEMS including a mirror for use as a light modulator for micro-mirror displays is shown. Non-optical MEMS may also be formed. Such structures are formed using photolithographic processes in one embodiment. A layer of tetraethylorthosilicate (TEOS) 130 or similar material contains a bond pad 135, and metal layers 140, 145 and 150. Bond pad 135 is exposed with a via through TEOS 130, and metal layers 140, 145 and 150 are formed within the layer of TEOS 130. A pair of electrodes 155 and 160 are formed on top of the TEOS 130. The electrodes 155 and 160 may be formed of Au (gold), Titanium nitride, Al (aluminum), or other conductive materials.

Figure 2:
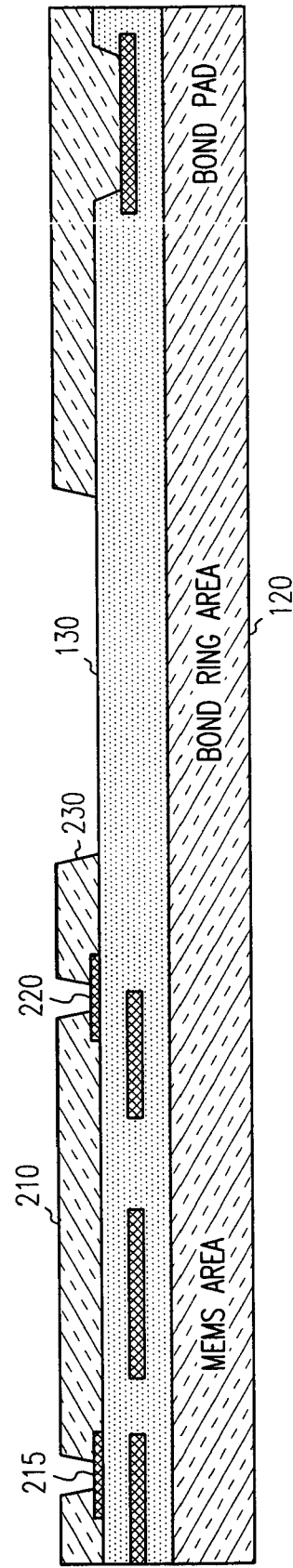

In FIG. 2, a sacrificial layer 210 is formed on top of the electrodes, 155 and 160, with respective vias 215 and 220 formed through the sacrificial layer. In one embodiment, the sacrificial layer 210 is formed of $SiO_2$, photoresist, amorphous silicon, or any other material that can be removed later in the process without adversely affecting the MEMS structure. A via 230 is formed in the sacrificial layer 210 to a bond ring area 120 of TEOS 130.

FIG. 3 shows the device 100 following formation of MEMS structures such as a hinge layer 310 and yoke layer 315. In one embodiment, such structures are formed of Al for reflective purposes. The materials used for such structures may vary greatly depending on the desired type of MEMS to be produced. The hinge layer 310 is in electrical contact with electrodes 155 and 160 in this embodiment. Yoke layer 315 is formed with two openings 317 and 318 to hinge layer 310. The openings 317 and 318 have edges, which may contain TEOS strips 320 that may remain from a hardmask and plasma etch process used to form the hinge layer 310 and yoke layer 315.

In FIG. 4, another layer of sacrificial material 410, usually the same type of material as sacrificial layer 210, is deposited and patterned to form a via 415 to yoke 315, and a via 420 to bond ring area 130. A mirror 510 is then patterned and etched as shown in FIG. 5 in the MEMS area 110. Mirror 510 extends down via 415 and over the exposed hinge area to form a pivot 520, allowing the mirror 510 to pivot when released from the sacrificial layers. A further sacrificial layer 610 is formed on top of mirror 510 and is patterned to provide a via 620 to the bond ring area 120 TEOS 130. When photoresist is used for a sacrificial layer, or MEMS protection layer, it is cured at up to 250° C. for a few minutes to an hour. In one embodiment, the photoresist should not be burned, which would make it harder to remove later in the process.

Figure 7:
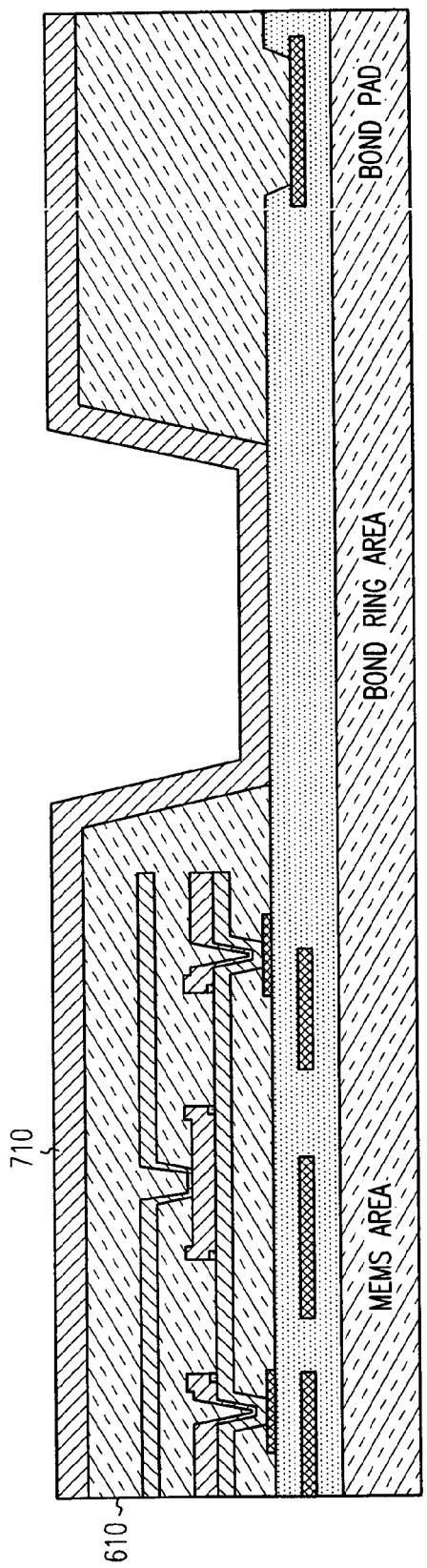

The sacrificial layers indicated at 610 effectively encapsulate and provide protection of the MEMS structures for deposition of a bond ring material 710 in FIG. 7. The bond ring material covers the sacrificial layer 610 as well as the bond ring area 120 of TEOS 130. In one embodiment, the bond ring material 710 is formed such that the height of it extending up from the bond ring area is higher than a height of the MEMS structures, allowing such structures to operate properly when a cover is fixed to the bond ring material later in processing. The bond ring material 710 is metal, such as Au in one embodiment, an AuSn alloy, or other material as desired. Other materials may also be used for the bond ring.

The bond ring material 710 is formed by a process selected from the group consisting of physical vapor deposition, sputtering, evaporation, plating, or chemical vapor deposition. Such processes should be controlled to not adversely affect the sacrificial layers. When the sacrificial layers are formed of resist, lower temperature processes should be used to avoid burning the sacrificial layers. When the sacrificial layers are formed of other materials, processes at higher temperatures may be employed.

Figure 8:
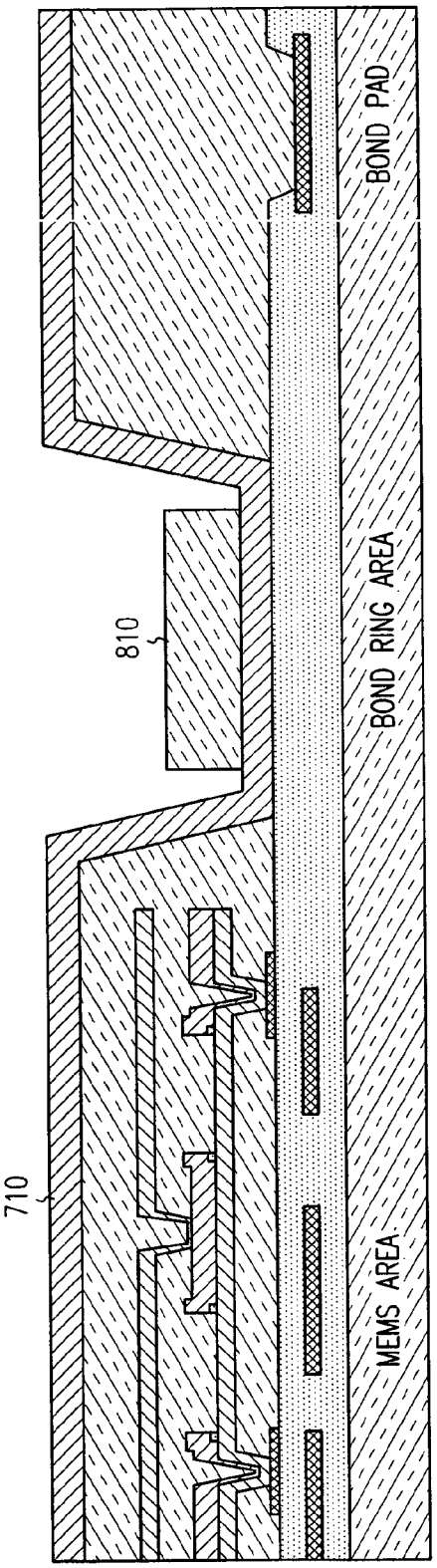
Figure 9:
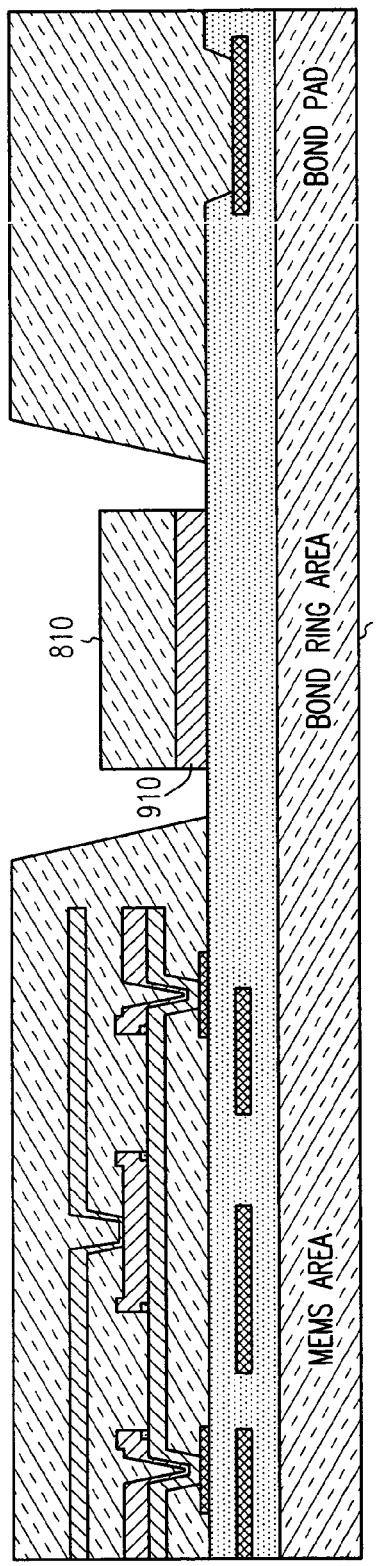

In further embodiments, the cover may contain a mating ring, providing sufficient height for proper operation of the MEMS structures. The bond ring material 710 is coated with a resist or material that is the same or compatible with the sacrificial layers. The resist is patterned to leave resist as indicated at 810 in FIG. 8 to define the shape of the bond ring.

Figure 10:
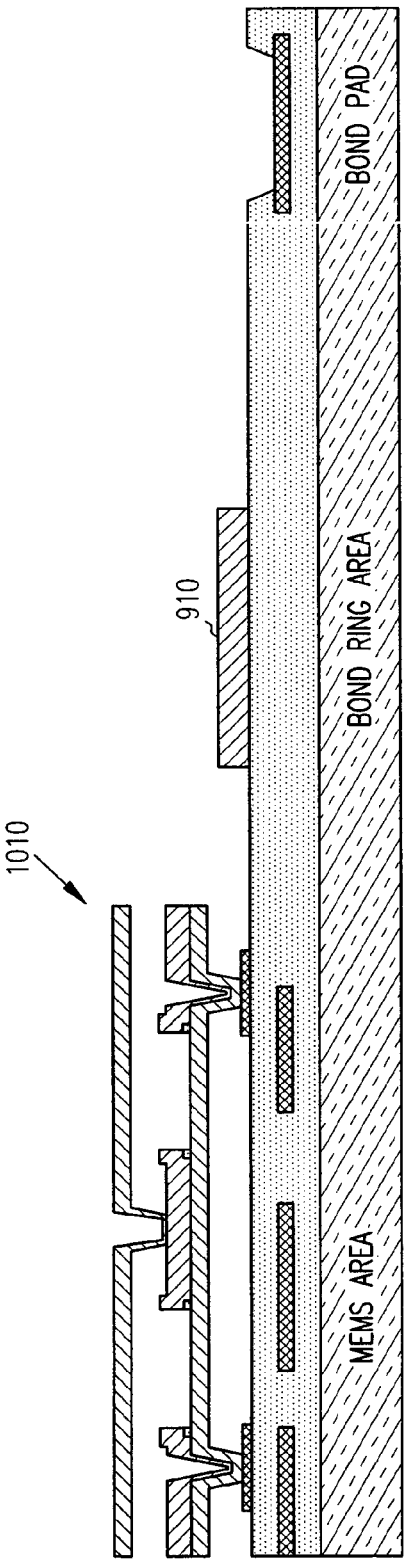

The bond ring material is removed via etching, leaving a bond ring 910 in the bond ring area 120. In FIG. 10, the sacrificial layers and resist or sacrificial layer 810 are removed, resulting in a released MEMS device as indicated at 1010 along with a bond ring 910 for attaching a cover for the MEMS device.

The bond ring 910 may alternatively be formed with a metal floor to promote adhesion of Au or Au alloys that form the bond ring in one embodiment. Further, Ta, or TaN may be used as an adhesion layer in some embodiments.

Figure 11:
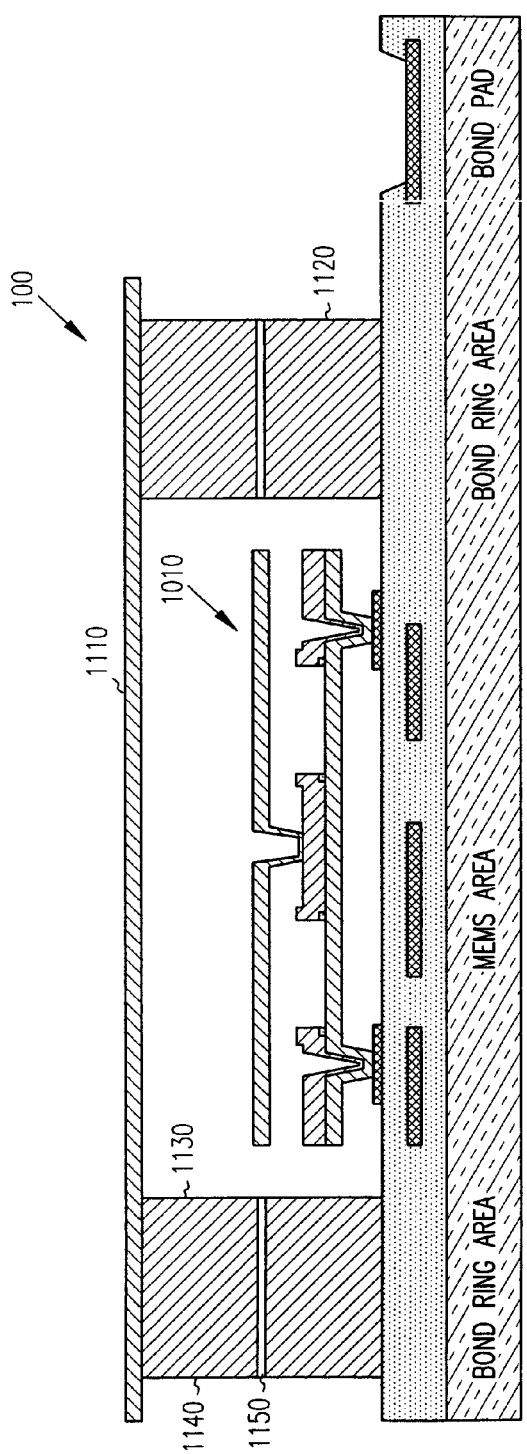
FIG. 11 is a side elevation representation of a device having a bond ring area coupled to a cover according to an embodiment of the invention.

FIG. 11 shows the device 100 with a cover 1110 coupled to a bond ring 1120 that may be formed higher than the MEMS device 1010. The cover 1110 may also have a mating ring 1130 that mates with the bond ring 1120 and provides additional height of the cover 1110 over the MEMS device 1010 allowing desired operation of MEMS device 1010. The cover 1110 may be formed of glass or other transparent material for optical type MEMS devices, or may be opaque. The characteristics of the cover 1110 should be compatible with any operating environment required for the MEMS device 1010. In one embodiment, the cover 1110 is coupled to the bond ring in accordance with U.S. application entitled: "Cover Secured to Bond Ring" application Ser. No. 10/683,910, filed on the same date herewith, which is incorporated herein by reference. In one embodiment, the cover mating ring 1130 is provided with a bonding layer 1140, and a tacking layer 1150 that provides a quick tacking type function allowing placement of the cover on the ring. The device 100 with cover 1110 is then heated at a later time in processing to provide a eutectic bond between the cover and the bond ring. The tacking layer 1150 provide sufficient adhesion to allow proper permanent bonding. This bond in one embodiment provides a hermetic seal for MEMS device 1010, allowing selection of an operating environment within the sealed area that contains the MEMS. Any type of fluid, such as liquid or gas may be used within the sealed area to obtain a desired operating environment.

Figure 12:
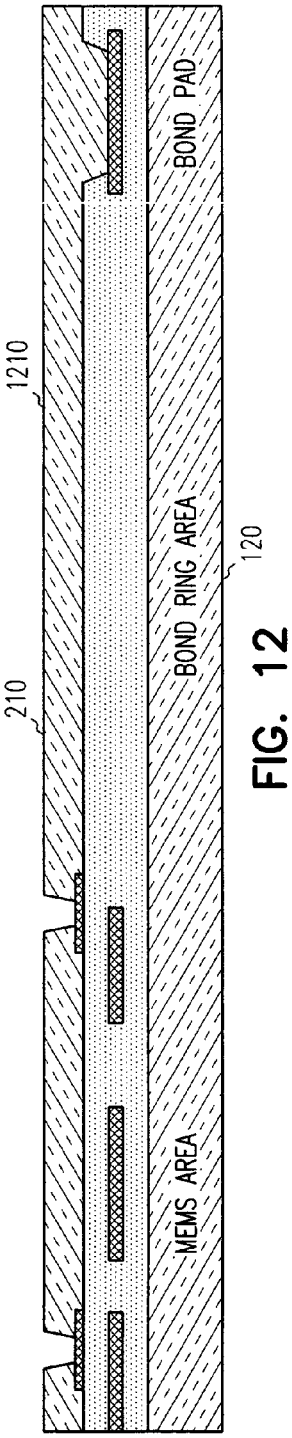
Figure 13:
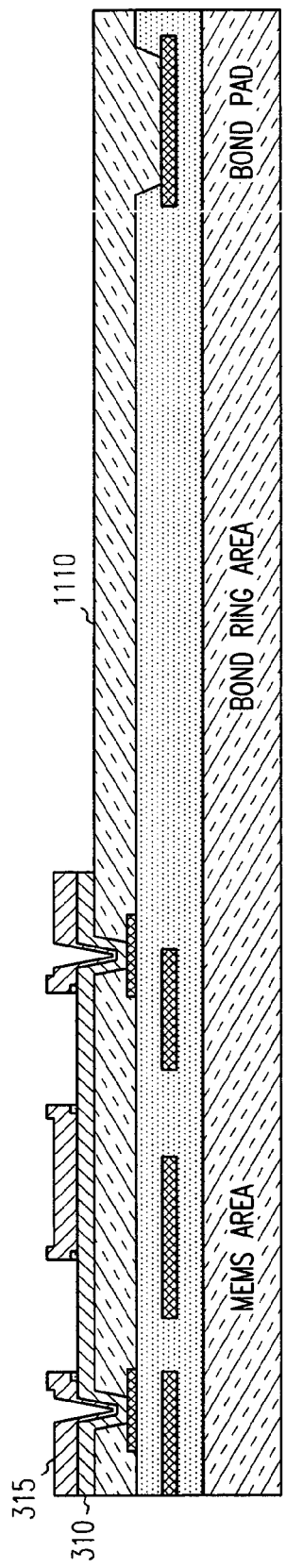
Figure 14:
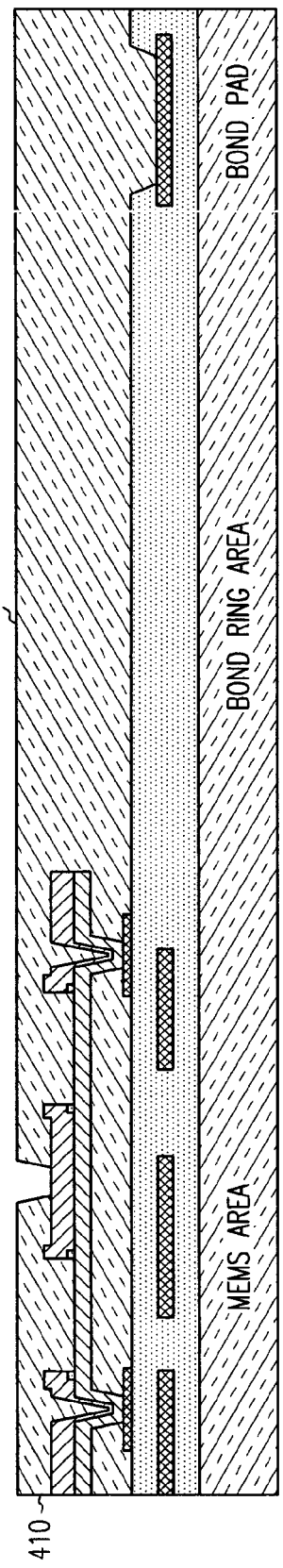

An alternative method of forming the bond ring is illustrated in FIGS. 12, 13, 14, 15, 16 and 17. In FIG. 12, the first sacrificial layer 210 extends beyond the MEMS area and also covers the bond ring area 120 as indicated at 1210. The yoke 310 and hinge 315 are then formed as shown in FIG. 13, without a via being formed to the bond ring area 120. A further sacrificial layer 410 in FIG. 14 is formed as before, but also extends over the bond ring area as indicated at 1410, without a via. The mirror 510 is then formed as shown in FIG. 15, followed by a protection layer 610 that protects the MEMS device as seen in FIG. 16. In one embodiment, the protection layer 610 is photoresist, and is exposed to provide an opening above the bond ring area 120 as indicated at 1610.

Figure 17:
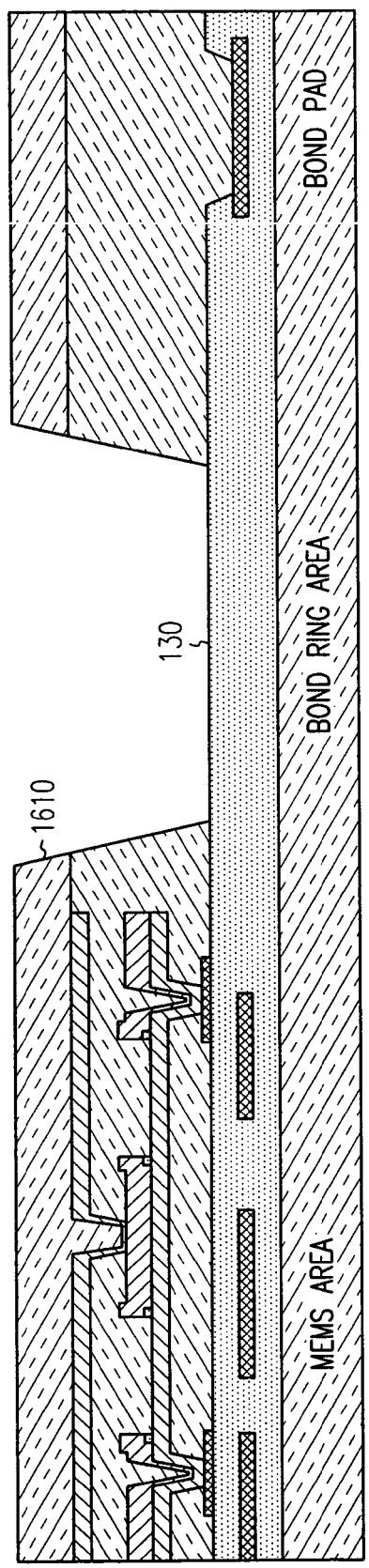

In FIG. 17, an etch of the sacrificial layers is performed through opening 1610 to the TEOS layer 130, and the bond ring is then formed in a manner similar or identical to that previously described.

Figure 18:
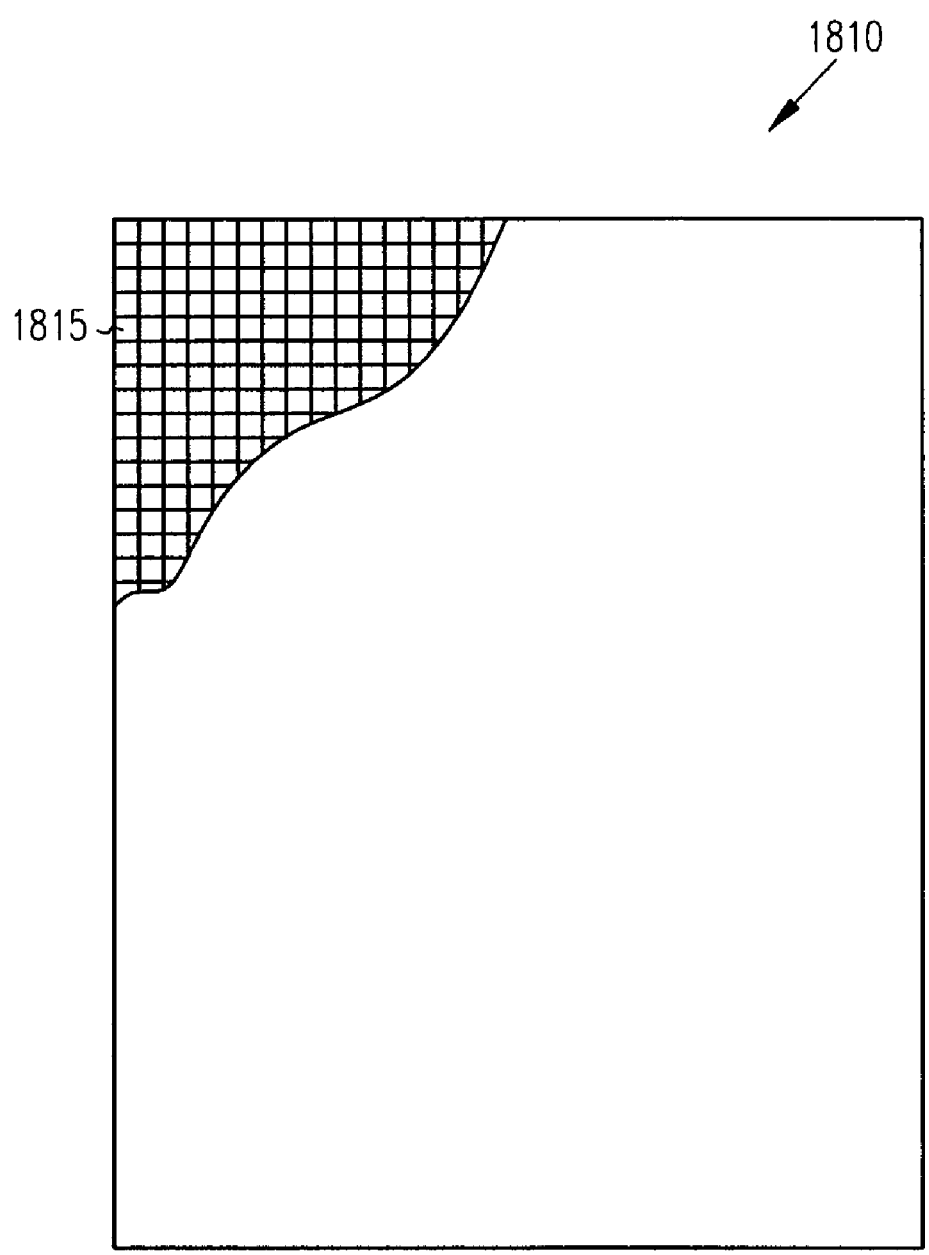
FIG. 18 is a partial top view of an example display device constructed of an array of devices according to an embodiment of the invention.

A partial cut away block representation of a micro-mirror display device incorporating an array of optical MEMS including a mirror used as a light modulator is shown in FIG. 18 generally at 1810. The display comprises an array of such optical MEMS, one of which is shown at 1815.

Although specific embodiments have been illustrated and described herein, those of ordinary skill in the art will appreciate that any arrangement calculated to achieve the same purpose can be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein will be apparent to those of skill in the art upon reviewing the above description. The scope of various embodiments of the invention includes any other applications in which the above structures and methods are used. Therefore, the scope of various embodiments of the invention should be determined with reference to the appended claims, along with the full range of equivalents to which such claims are entitled.

What is claimed is:

1. A method of forming a microelectromechanical system (MEMS) device comprising:

forming mechanical, structures supported by a substrate having a bond ring area laterally spaced from the mechanical structures and having a first sacrificial layer encapsulating the mechanical structures;

forming a bond ring material on top of the first sacrificial layer and the bond ring area;

forming second sacrificial layer on top of at least a portion of the bond ring material and the bond ring area;

removing some of the bond ring; and removing at least a portion of the second sacrificial layer to expose a bond ring.

2. The method of claim 1 wherein one or both of the first and second sacrificial layers comprise photo resist.

3. The method of claim 1 wherein one or both of the first and sacrificial layers comprise silicon dioxide.

4. The method of claim 1 wherein one or both of the first and sacrificial layers comprise amorphous silicon.

5. The method of claim 1 wherein one or both of the first and sacrificial layers comprise a sacrificial layer having sufficient etch selectivity to not significantly adversely affect the mechanical structures when removed.

6. The method of claim 1 wherein the bond ring material comprises gold.

7. The method of claim 1 and further comprising removing the first and second sacrificial layers after removing some of the bond ring material.

8. The method of claim 1 and further comprising forming an eutectic bond with the remaining bond ring material.

9. A method of forming a microelectromechanical system (MEMS) device comprising:

forming mechanical structures supported by a substrate and having a first sacrificial layer encapsulating the mechanical structures;

forming a bond ring area laterally spaced from the mechanical structures and supported by the substrate, the bond ring area having a portion without the first sacrificial layer thereon;

forming a conductive layer on top of the first sacrificial layer and the bond ring area;

forming second sacrificial layer on top of at least a portion of the conductive layer and the bond ring area;

removing some of the conductive layer such that the conductive layer remains in the portion of the bond ring area; and removing the first and second sacrificial layers to release the mechanical structures and to reveal the conductive layer remaining in the bond ring area.

10. The method of claim 9 wherein one or both of the first and sacrificial layers comprise a sacrificial layer having sufficient etch selectivity to not significantly adversely affect the mechanical structures when removed.

11. The method of claim 9 wherein one or both of the first and sacrificial layers comprise photo resist.

12. The method of claim 9 wherein one or both of the first and sacrificial layers comprise silicon dioxide.

13. The method of claim 9 wherein one or both of the first and sacrificial layers comprise amorphous silicon.

14. The method of claim 9 wherein the conductive layer is formed by a process selected from the group consisting of physical vapor deposition, sputtering, evaporation, plating, or chemical vapor deposition.

15. The method of claim 9 and further comprising bonding a cover to the conductive layer remaining in the bond ring area.

16. The method of claim 15 wherein the cover is transparent.

17. The method of claim 15 wherein the cover is supported sufficiently above the mechanical structures to allow operation of such structures.

18. A microelectromechanical system (MEMS) device formed by a method comprising:

forming mechanical structures supported by a substrate and having a first sacrificial layer encapsulating the mechanical structures;

forming a bond ring area laterally spaced from the mechanical structures, the bond ring area having a portion without the first sacrificial layer thereon;

forming a layer of bond ring material over the first sacrificial layer and the bond ring area;

forming second sacrificial layer on top of at least a portion of the bond ring material and the bond ring area;

removing some of the bond ring material to form a bond ring in the bond ring area; and removing the first and second sacrificial layers to release the mechanical structures and to expose the bond ring.

19. The MEMS device of claim 18 wherein the method of forming further comprises bonding a cover to the bond ring.

20. The MEMS device of claim 19 wherein the cover is transparent.

21. The MEMS device of claim 19 wherein the bond ring is annular in shape and surrounds the mechanical structures.

22. The MEMS device of claim 18 wherein the mechanical structure comprises a micro-mirror.

* * * * *

UNITED STATES PATENT AND TRADEMARK OFFICE
CERTIFICATE OF CORRECTION

PATENT NO. : 6,979,585 B2
APPLICATION NO. : 10/683909
DATED : December 27, 2005
INVENTOR(S) : Nikkel et al.

It is certified that error appears in the above-identified patent and that said Letters Patent is hereby corrected as shown below:

Col. 4 (line 35), delete "mechanical," and insert therefor --mechanical--.

Col. 4 (line 43), delete "ring;" and insert therefor --ring material;--.

Signed and Sealed this

Fifteenth Day of August, 2006

JON W. DUDAS
*Director of the United States Patent and Trademark Office*